US009142601B2

(12) United States Patent
Park et al.

(10) Patent No.: US 9,142,601 B2
(45) Date of Patent: Sep. 22, 2015

(54) ORGANIC LIGHT EMITTING DISPLAY

(75) Inventors: Dong-Wook Park, Yongin (KR);
Ki-Wook Kim, Yongin (KR);
Keum-Nam Kim, Yongin (KR)

(73) Assignee: Samsung Display Co., Ltd.,
Gyeonggi-Do (KR)

( * ) Notice: Subject to any disclaimer, the term of this patent is extended or adjusted under 35 U.S.C. 154(b) by 365 days.

(21) Appl. No.: 13/413,557

(22) Filed: Mar. 6, 2012

(65) Prior Publication Data

US 2012/0229437 A1    Sep. 13, 2012

(30) Foreign Application Priority Data

Mar. 11, 2011    (KR) .................. 10-2011-0021979

(51) Int. Cl.
*H01L 27/15*      (2006.01)
*H01L 27/32*      (2006.01)
*H01L 51/52*      (2006.01)

(52) U.S. Cl.
CPC ......... *H01L 27/3276* (2013.01); *H01L 27/3246* (2013.01); *H01L 51/5225* (2013.01); *H01L 51/5259* (2013.01)

(58) Field of Classification Search
CPC ........ H05B 33/22; H05B 33/26; H05B 33/28; H05B 33/06; H05B 33/24; H01L 27/3244; H01L 27/3276; H01L 51/5203; H01L 2224/73265; F21Y 2101/02; F21Y 2105/008
USPC ..................................... 313/498–512; 257/40
See application file for complete search history.

(56) References Cited

U.S. PATENT DOCUMENTS

| 2003/0071563 A1* | 4/2003 | Hamada et al. ............... 313/500 |
| 2007/0013299 A1* | 1/2007 | Hamada et al. ............... 313/505 |
| 2008/0018229 A1* | 1/2008 | Yamazaki ..................... 313/498 |
| 2009/0200937 A1* | 8/2009 | Sagawa et al. ............... 313/505 |
| 2010/0109512 A1* | 5/2010 | Shin ............................. 313/504 |
| 2010/0301366 A1* | 12/2010 | Takahashi ...................... 257/98 |
| 2012/0097987 A1* | 4/2012 | Ryu et al. ........................ 257/88 |

FOREIGN PATENT DOCUMENTS

| KR | 10-0700644 B1    | 3/2007 |
| KR | 10-0712287 B1    | 4/2007 |
| KR | 10-2008-0045886 A | 5/2008 |
| KR | 10-2009-0111082 A | 10/2009 |

* cited by examiner

*Primary Examiner* — Karabi Guharay
*Assistant Examiner* — Nathaniel Lee
(74) *Attorney, Agent, or Firm* — Knobbe Martens Olson & Bear LLP

(57) ABSTRACT

An organic light emitting display is disclosed. According to some aspects, the display includes a substrate having a display region and a peripheral region that surrounds the display region. The display further includes a pixel in the display region, and a contact unit in the peripheral region. The contact unit is configured to receive a common power signal from an external power source. A wiring line unit on the substrate provides a driving signal to the pixel. The pixel includes a first electrode provided on the substrate, an organic light emitting layer provided on the first electrode, and a second electrode that protrudes toward the contact unit on a plane to be electrically coupled to the contact unit. As a result, the area in which the second electrode overlaps the wiring line unit in the peripheral region is reduced and the parasitic capacitance that may be generated between the second electrode and the wiring line may be reduced.

10 Claims, 4 Drawing Sheets

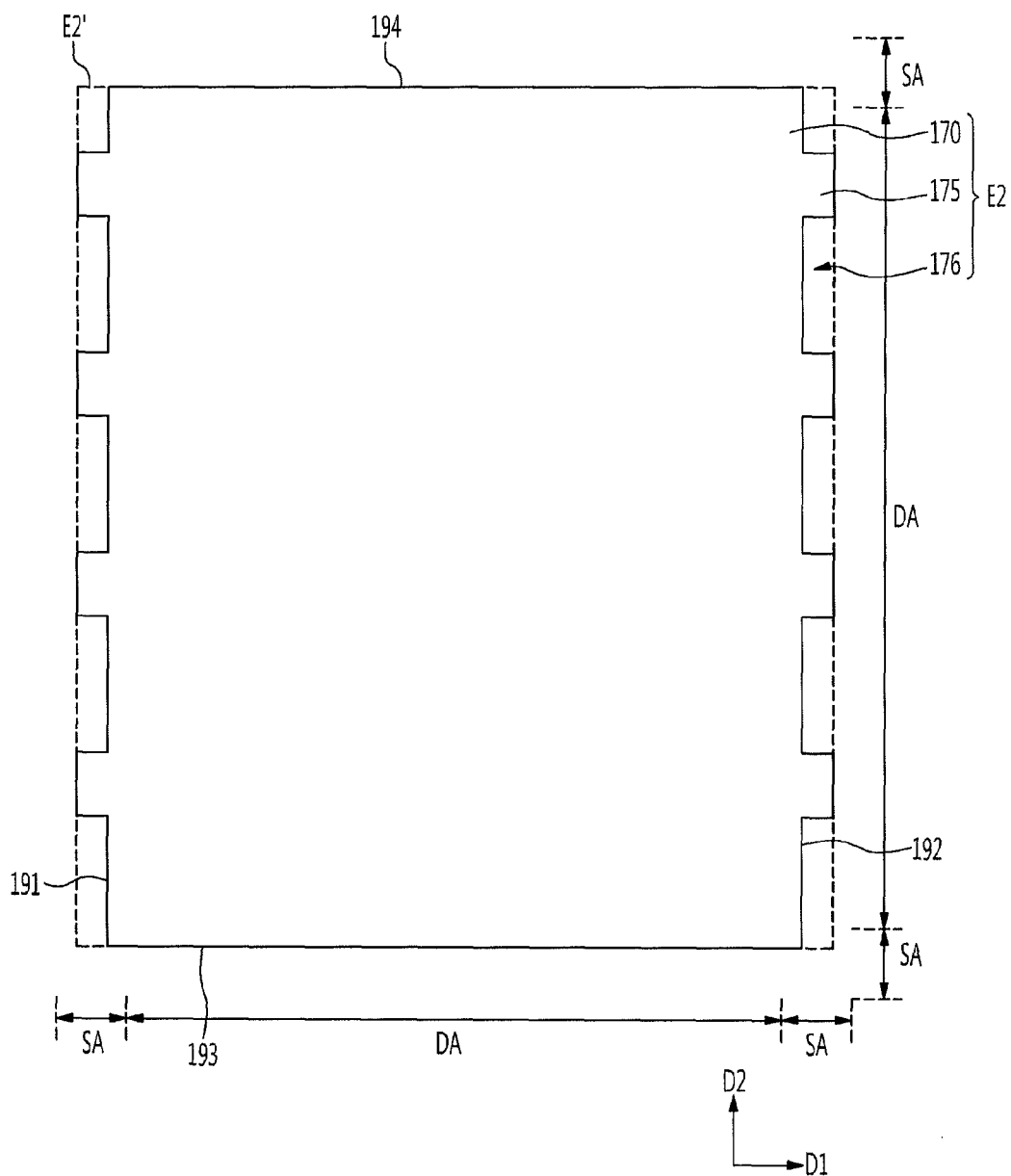

ORGANIC LIGHT EMITTING DISPLAY

CROSS-REFERENCE TO RELATED APPLICATIONS

This application claims priority to and the benefit of Korean Patent Application No. 10-2011-0021979, filed on Mar. 11, 2011, in the Korean Intellectual Property Office, the entire content of which is incorporated herein by reference.

BACKGROUND

1. Field

The disclosed technology relates to an organic light emitting display, and more particularly, to an organic light emitting display capable of improving quality of a displayed image.

2. Description of the Related Technology

An organic light emitting display contains numerous pixels, which include organic light emitting diodes (OLED) that generate light. Generally, the pixels include switching transistors coupled to driving transistors for driving the OLEDs. The switching transistors are configured to control the light emission characteristics of the OLEDs in response to the switching operations of the switching transistors. in the usual configuration, the gate electrodes of the switching transistors are coupled to gate lines, the source electrodes of the switching transistors are coupled to data lines, and the source electrodes of the driving transistors are coupled to power source supply lines. Signal transmission lines configured to drive the above-described pixels may be formed on a substrate as a signal bus.

Alternatively, the OLEDs include anode electrodes, cathode electrodes, and organic light emitting layers interposed between the anode electrodes and the cathode electrodes. The cathode electrodes may be formed on the substrate to cover all of the pixels unlike the anode electrodes. With this arrangement, the cathode electrodes may overlap the plurality of signal transmission lines formed on the substrate. As a result, a parasitic capacitance is produced. The parasitic capacitance has the effect of disrupting the smooth flow of a signal so that the display quality of the organic light emitting display is reduced.

SUMMARY OF CERTAIN INVENTIVE ASPECTS

Accordingly, aspects of this disclosure describe an organic light emitting display having an improved display quality.

According to one aspect, an organic light emitting display (OLED) is disclosed. The OLED includes a substrate having a display region and a peripheral region that surrounds the display region, a pixel in the display region, a contact unit in the peripheral region configured to receive a common power signal from an external power supply, and a wiring line unit on the substrate configured to drive the pixel. The pixel includes a first electrode on the substrate, an organic light emitting layer on the first electrode, and a second electrode that protrudes toward the contact unit within a plane and electrically coupled to the contact unit.

BRIEF DESCRIPTION OF THE DRAWINGS

The accompanying drawings, together with the specification, illustrate some embodiments, and, together with the description, serve to explain the aspects of the present invention.

FIG. 5 is a plan view illustrating a second electrode of FIG. 2.

DETAILED DESCRIPTION OF CERTAIN INVENTIVE EMBODIMENTS

Figure 1:
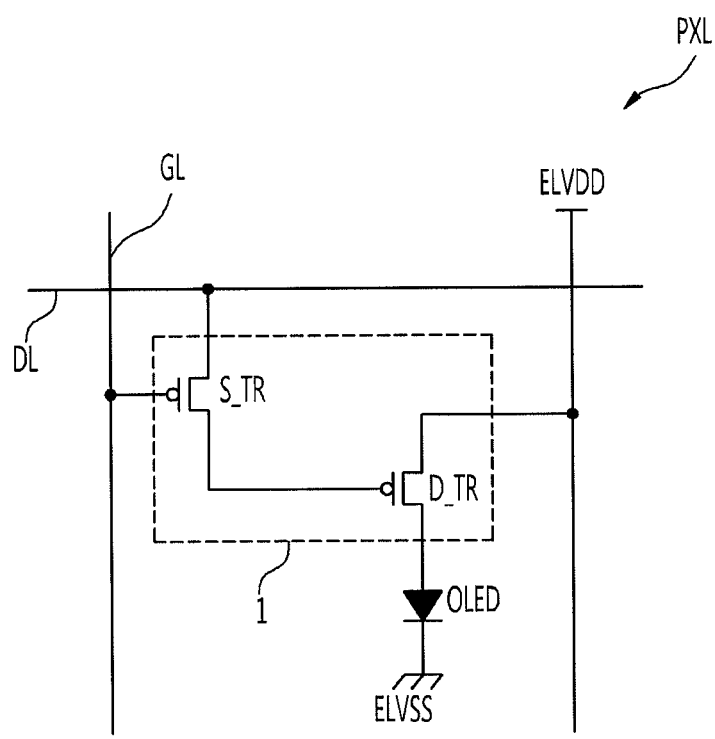
FIG. 1 illustrates a circuit for driving one pixel of an organic light emitting display according to some embodiments.

Hereinafter, certain embodiments will be described with reference to the accompanying drawings. In the disclosure, when a first element is described as being coupled to a second element, the first element may be not only be directly coupled to the second element but may also be indirectly coupled to the second element via a third element. Further, some of the elements that are not essential to the complete understanding of the invention are omitted for clarity. Like reference numerals refer to like elements throughout the specification.

Hereinafter, some embodiments will be described in detail with reference to the accompanying drawings. The objects, characteristics, and effects of the described embodiments will be easily understood through the description and the corresponding drawings. However, the present invention is not limited to these embodiments described herein, and various modifications may exist. The description of the embodiments is provided to clarify the aspects of the present invention to those of ordinary skill in the art. Therefore, the appended claims should not be construed as being limited to the following embodiments. Rather, the illustrated drawings together with the description of the accompanying embodiments are simplified or exaggerated for clarity.

FIG. 1 is illustrates a circuit for driving one pixel of an organic light emitting display according to an embodiment of the present invention. With reference to FIG. 1, a pixel PXL includes an organic light emitting diode (OLED) and a pixel circuit 1 coupled to a data line DL and a gate line GL to control the emission operation of the OLED.

The OLED includes an anode electrode and a cathode electrode. The anode electrode is coupled to the pixel circuit 1. The cathode electrode is coupled to a first power source supply line ELVSS. The OLED having the above structure may receive current from the pixel circuit 1 to emit light.

The pixel circuit 1 includes a switching transistor S_TR and a driving transistor D_TR electrically coupled to the switching transistor S_TR. The gate electrode and the source electrode of the switching transistor S_TR are coupled to the gate line GL and the data line DL, respectively. As a result, when a gate signal is provided to the switching transistor S_TR through the gate line GL, the switching transistor S_TR may be turned on.

When the switching transistor S_TR is turned on, the data signal transmitted through the data line DL is received by the gate electrode of the driving transistor D_TR to turn on the driving transistor D_TR.

When the driving transistor D_TR is turned on, the current that flows through a second power source supply line ELVDD is received by the anode electrode of the OLED. As a result, the OLED may emit light corresponding to the current provided from the first power source supply line ELVSS to the cathode electrode and the current provided from the second power source supply line ELVDD to the anode electrode.

Figure 2:
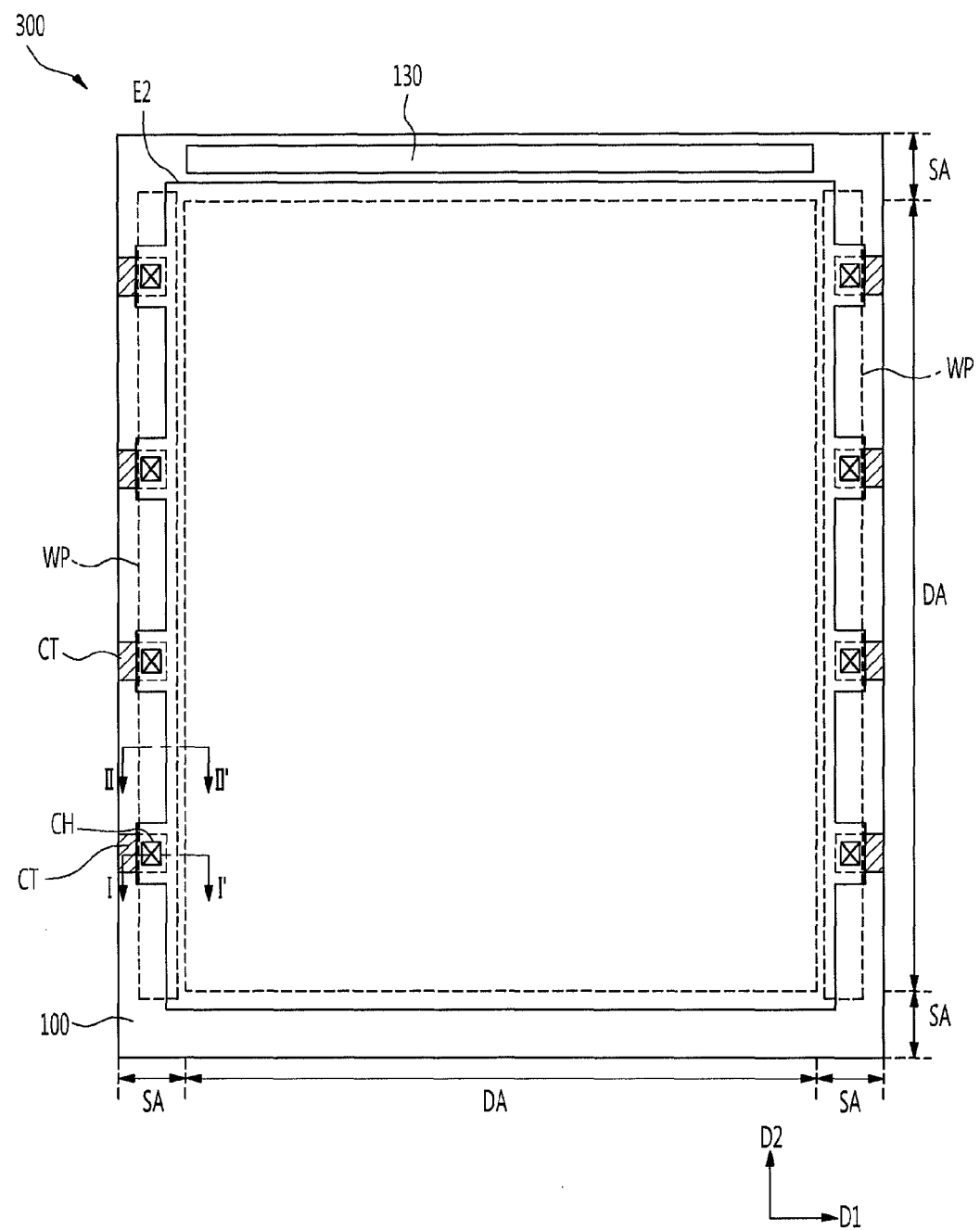
FIG. 2 illustrates a plan view of an organic light emitting display having the pixel of FIG. 1.
Figure 3:
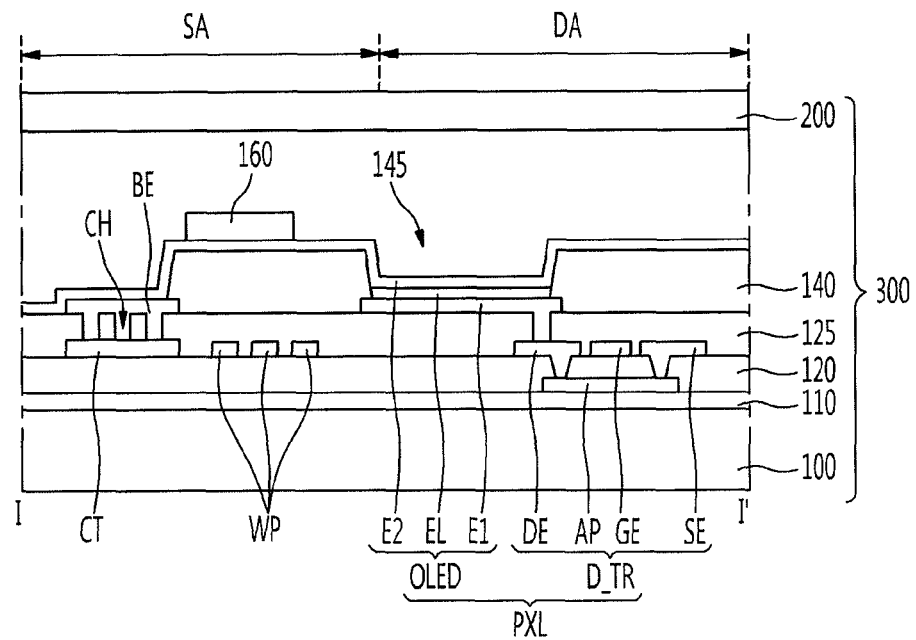
FIG. 3 illustrates a sectional view of the organic light emitting display taken along the line I-I' of FIG. 2.
Figure 4:
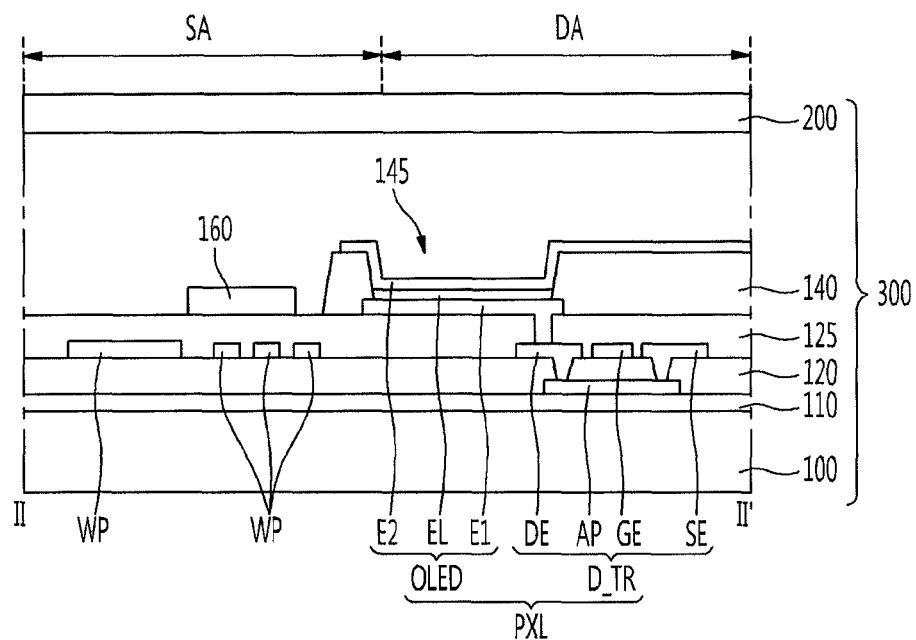
FIG. 4 illustrates a sectional view of the organic light emitting display taken along the line II-II' of FIG. 2.

FIG. 2 illustrates a plan view of an organic light emitting display having the pixel of FIG. 1. FIG. 3 is a sectional view illustrating the part taken along the line I-I' of FIG. 2. FIG. 4 is a sectional view illustrating the part taken along the line II-II' of FIG. 2.

With reference to FIGS. 2, 3, and 4, an OLED 300 includes a substrate 100, a pixel PXL, a contact unit CT, a data driver 130, a wiring line unit WP, and a sealing substrate 200.

The substrate 100 has a display region DA. The display region DA includes the pixel PXL described with reference to FIG. 1. The pixel PXL emits light used by the OLED 300 for displaying an image. In some embodiments, a plurality of pixels PXL are provided in the display region DA. However, since the plurality of pixels have substantially similar structures; one pixel PXL among the plurality of pixels will be described as an example.

The pixel PXL includes the driving transistor D_TR and the OLED electrically coupled to the driving transistor D_TR to emit light in response to the switching operation of the driving transistor D_TR.

The driving transistor D_TR includes an active pattern AP, a gate electrode GE, a source electrode SE, and a drain electrode DE.

The active pattern AP is provided on a substrate 100 where a buffer layer 110 is formed. According to some embodiments, the active pattern AP may include poly-silicon or amorphous silicon. In addition, the active pattern AP may include a channel region (not shown), a source region, and a drain region that face each other. The channel region may be interposed between the source region and the drain region which have higher dopant density than the channel region.

The source electrode SE and the drain electrode DE are formed on a gate insulating layer 120 that covers the active pattern AP to contact the active pattern AP through the contact holes formed in the gate insulating layer 120. In addition, the gate electrode GE is formed on the gate insulating layer 120 between the source electrode SE and the drain electrode DE to overlap the active pattern AP.

An interlayer insulating layer 125 is provided on the driving transistor D_TR. The OLED is provided on the interlayer insulating layer 125. The OLED includes a first electrode E1, an organic light emitting layer EL, and a second electrode E2.

The first electrode E1 is provided on the interlayer insulating layer 125. The first electrode E1 is electrically coupled to the drain electrode DE through the contact hole formed in the interlayer insulating layer 125. In addition, according to some embodiments, the first electrode E1 may be the anode electrode of the OLED and the first electrode E1 may be electrically coupled to the second power source supply line (ELVDD of FIG. 1) described with reference to FIG. 1 to receive a power source.

The organic light emitting layer EL is provided on the first electrode E1. In detail, a pixel defining layer 140 in which a recess unit 145 is formed on the interlayer insulating layer 125. The recess unit 145 is formed by partially removing the interlayer insulating layer 125 to correspond to the position of the first electrode E1. The organic light emitting layer EL is filled in the recess unit 145 and is formed on the first electrode E1.

The second electrode E2 is provided on the pixel defining layer 140 and the organic light emitting layer EL. The second electrode E2 is provided on the substrate 100 to cover all of the plurality of pixels formed in the display region DA unlike the first electrode E1. According to some embodiments, the second electrode E2 may be a cathode electrode of the OLED and may be electrically coupled to the first power source supply line (ELVSS of FIG. 1) described with reference to FIG. 1 to receive a power source.

Furthermore, the substrate 100 includes a peripheral region SA that surrounds the display region DA. The peripheral region SA includes the data driver 130 and the contact unit CT. The contact unit CT is electrically coupled to the second electrode E2 in the peripheral region SA. The structure of the OLED 300 corresponding to the peripheral region SA will be described in detail below.

The data driver 130 is provided at one end of the peripheral region SA to generate a data signal. The data line (DL of FIG. 1) is withdrawn from the data driver 130 to transmit the data signal to the pixel PXL.

The contact unit CT is provided in the peripheral region SA and may be electrically coupled to the second electrode E2. According to some embodiments, the contact unit CT may include plural sections and the plurality of contact unit sections may be arranged on the both ends of the substrate 100. The plural contact unit sections may be configured to face each other and be separated from each other along a second direction D2. On the other hand, since the plurality of contact units have the same structure, one contact unit CT among the plurality of contacts will be described as an example.

The contact unit CT is provided on the gate insulating layer 120 in the peripheral region SA. The interlayer insulating layer 125 in which a contact hole CH is formed is provided in the contact unit CT. Therefore, a part of the second electrode E2 may extend from the display region DA to the peripheral region SA and may be electrically coupled to the contact unit CT through the contact hole CH.

According to some embodiments, and with reference to FIG. 2, a coupling electrode BE may be provided between the contact unit CT and the second electrode E2 and the contact unit CT may be electrically coupled to the second electrode E2 by the coupling electrode BE.

The wiring line unit WP is electrically coupled to the pixel PXL to provide a driving signal to the pixel PXL. According to some embodiments, the wiring line unit WP may consist of a plurality of wiring lines having the shape of a bus line. The plurality of wiring lines may include at least one of the gate line (GL of FIG. 1), the data line (DL of FIG. 1), the first power source supply line (ELVSS of FIG. 1), and the second power source supply line (ELVDD of FIG. 1) that are described with reference to FIG. 1. In addition, the wiring line unit WP is extended from the peripheral region SA to the display region DA. However, for ease of description, in FIG. 2, only a part of the wiring line WP provided in the peripheral region SA is illustrated.

According to the embodiments, the shape of the second electrode E2 may be related to the positions of the contact unit CT and the wiring line unit WP, which will be described in detail with reference to FIG. 5.

FIG. 5 is a plan view illustrating the second electrode of FIG. 2. With reference to FIGS. 2 and 5, the second electrode E2 includes a body 170, a plurality of coupling units 175, and a concave unit 176.

According to some embodiments, the body 170 covers the display region DA. Along a plane of the body 170, the body 170 is in the shape of a square having a first side 191 and a second side 192 parallel with the second direction D2 and a third side 193 and a fourth side 194 parallel with the first direction D1 and perpendicular to the second direction D2.

The plurality of coupling units 175 protrude from the first side 191 and the second side 192 of the body 170 in the plane and may correspond to the number of contact units CT and may overlap each other on a plane. Therefore, according to some embodiments, the number of coupling units 175 may be equal to the number of contact units CT and the plurality of coupling units 175 may be electrically coupled to the contact units CT to correspond to the number of contact units CT through the contact hole CH.

The concave unit 176 may be provided between two adjacent coupling units. Along a plane of the electrode, the concave unit 176 overlaps the wiring line unit WP provided in the peripheral region SA. As a result, in the peripheral region SA, the second electrode E2 does not overlap the wiring line unit WP by the concave unit 176. According to the above-described structure, the area in which the second electrode E2 overlaps the wiring line unit WP is reduced. As a result, the parasitic capacitance generated between the wiring line unit WP and the second electrode E2 may be reduced.

That is, when a virtual temporary electrode E2' is defined by coupling the ends of the coupling units 175 positioned on the same extending line, the second electrode E2 is obtained by reducing the area of the temporary electrode E2' from the temporary electrode E2' by the area corresponding to the concave unit 176. Therefore, the part of the electrode that overlaps the wiring line unit WP is removed from the temporary electrode E2' to define the shape of the second electrode E2. As a result, the parasitic capacitance may be reduced.

According to some embodiments, and with returned reference to FIGS. 3 and 4, a moisture absorbing layer 160 may be provided in the peripheral region SA and may be provided on the pixel defining layer 140 with the second electrode E2 interposed between the pixel defining layer 140 and absorbing layer 160. The moisture absorbing layer 160 absorbs the moisture that may be received by the OLED to prevent a reduction in the emission of light by the OLED due to moisture.

According to some embodiments the moisture absorbing layer 160 is provided in the peripheral region SA. Additionally or alternatively, the moisture absorbing layer 160 may be further provided in the display region DA as well as in the peripheral region SA.

The sealing substrate 200 may be provided to face the substrate 100. The sealing substrate 200 may be coupled to the substrate 100 by a coupling member (not shown) such as sealant. Additionally or alternatively, the sealing substrate 200 may be omitted. In this case, a protective layer (not shown) that covers the OLED may be formed on the uppermost layer of the substrate 100.

According to some embodiments, the area of the pixel defining layer 140 formed in the peripheral region SA may be reduced by a difference between the area of the temporary electrode (E2' of FIG. 5) and the second electrode (E2 of FIG. 5). For example, with reference to FIG. 3, in the region where the contact unit CT contacts the second electrode E2, the pixel defining layer 140 may be formed not to overlap the contact unit CT on a plane. Therefore, the area in which the pixel defining layer 140 is formed may be reduced from the peripheral region SA.

In addition, in this case, the position of the moisture absorbing layer 160 that may be formed to be adjacent to the end of the pixel defining layer in the peripheral region SA may be shifted to be closer to the display region DA. As a result, the areas of the pixel defining layer 140 and the moisture absorbing layer 160 that are provided in the peripheral region SA may be reduced such that the peripheral region SA may be compactly designed.

As described above, an OLED having a reduced parasitic capacitance is disclosed. According to one aspect, the OLED includes a substrate having a display region and a peripheral region that surrounds the display region, a pixel provided in the display region, a contact unit provided in the peripheral region to receive a common power signal from an external power source, and a wiring line unit provided on the substrate to provide a driving signal to the pixel. The pixel includes a first electrode provided on the substrate, an organic light emitting layer provided on the first electrode, and a second electrode that protrudes toward the contact unit on a plane to be electrically coupled to the contact unit.

The second electrode includes a body for covering the display region and a coupling unit that protrudes from the body to the contact unit on a plane to be electrically coupled to the contact unit.

The display includes a plurality of contact units and a plurality of coupling units and the plurality of contact units and the plurality of coupling units overlap each other to correspond to each other one to one on a plane.

A part of the wiring line unit positioned between two adjacent contact units is separated from the second electrode on a plane.

According to some embodiments, the area in which the cathode electrode of the OLED overlaps the wiring line unit provided in a peripheral region is reduced so that the parasitic capacitance that may be generated between the cathode electrode and the wiring line unit may be reduced. Therefore, the flow of the driving signal of the pixel transmitted by the wiring line unit may be made smooth so that the display quality of the organic light emitting display may be improved.

In addition, as described above, when the cathode electrode is designed so that the area in which the wiring line unit formed in the peripheral region overlaps the cathode electrode on a plane is reduced, the position of the moisture absorbing layer formed to surround the pixel defining layer in the peripheral region may be shifted to be closer to the display region. Therefore, the pixel defining layer and the moisture absorbing layer provided in the peripheral region may be reduced so that the peripheral region may be compactly designed.

While the present invention has been described in connection with certain embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display, comprising:
   a substrate having a display region and a peripheral region that surrounds the display region;
   a plurality of pixels in the display region;
   a contact unit having a plurality of contact unit sections in the peripheral region configured to receive a common power signal from an external power supply; and
   a wiring line unit on the substrate configured to drive the pixel;
   wherein the pixel comprises:
   an insulating layer on the substrate, the insulating layer having a plurality of contact channels formed therein;
   a first electrode on the insulating layer;
   an organic light emitting layer on the first electrode;
   a second electrode that protrudes toward at least one of the plurality of contact unit sections within a plane and
   a coupling electrode disposed between one of the plurality of contact unit sections and the second electrode;
   wherein the second electrode is electrically coupled to each of the plurality of contact unit sections via the plurality of contact channels, and wherein the second electrode overlaps the wiring line unit in the display region.

2. The organic light emitting display as claimed in claim 1, wherein the second electrode comprises:
   a body covering the display region; and
   a coupling unit protruding from the body and extending to the contact unit within a plane and electrically coupled to the contact unit.

3. The organic light emitting display as claimed in claim 2, wherein the coupling unit comprises a plurality of coupling unit sections,
   wherein each of the plurality of contact unit sections and the plurality of coupling unit sections overlap each other within a plane, and wherein a number of the plurality of contact unit sections corresponds to a number of the plurality of coupling unit sections.

4. The organic light emitting display as claimed in claim 3, wherein a part of the wiring line unit positioned between two adjacent contact unit sections is separated from the second electrode within the plane.

5. The organic light emitting display as claimed in claim 3,
   wherein the second electrode comprises a concave unit provided between two adjacent coupling units, and
   wherein the size of an area in which the wiring line unit positioned in the peripheral region overlaps the second electrode on a plane is reduced by the concave unit.

6. The organic light emitting display as claimed in claim 3,
   wherein the body has a shape of a square having four sides, and
   wherein the plurality of coupling units are arranged along at least one of the four sides.

7. The organic light emitting display as claimed in claim 1, further comprising:
   a driving transistor electrically coupled to the first electrode;
   a switching transistor electrically coupled to the driving transistor to switch the driving transistor;
   a gate line electrically coupled to a gate electrode of the switching transistor;
   a data line electrically coupled to a source electrode of the switching transistor; and
   a power source supply line electrically coupled to the source electrode of the driving transistor,
   wherein the wiring line comprises at least one of the gate line, the data line, and the power source supply line.

8. The organic light emitting display as claimed in claim 1, further comprising a pixel defining layer on the substrate, the pixel defining layer having a recess unit, wherein the organic light emitting layer is in the recess unit, and
   wherein the pixel defining layer is separated from the coupling unit within a plane.

9. The organic light emitting display as claimed in claim 8, further comprising a moisture absorbing layer in the peripheral region on the pixel defining layer, wherein the second electrode is interposed between the pixel defining layer and the moisture absorbing layer, and
   wherein the moisture absorbing layer is separated from the coupling unit within the plane.

10. The organic light emitting display as claimed in claim 9, further comprising a sealing substrate facing the substrate.

* * * * *